United States Patent
Sisler et al.

(10) Patent No.: US 9,611,404 B2
(45) Date of Patent: *Apr. 4, 2017

(54) METHOD OF MAKING SACRIFICIAL COATING FOR AN INTERMEDIATE TRANSFER MEMBER OF INDIRECT PRINTING APPARATUS

(71) Applicant: XEROX CORPORATION, Norwalk, CT (US)

(72) Inventors: Gordon Sisler, Ontario (CA); Guiqin Song, Milton (CA); Brynn Dooley, Toronto (CA); Marcel P. Breton, Mississauga (CA); Suxia Yang, Mississauga, CA (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/493,569

(22) Filed: Sep. 23, 2014

(65) Prior Publication Data

US 2016/0083607 A1  Mar. 24, 2016

(51) Int. Cl.
  *C09D 129/04* (2006.01)
  *C09D 125/14* (2006.01)
  (Continued)

(52) U.S. Cl.
  CPC ............ *C09D 129/04* (2013.01); *C08K 5/053* (2013.01); *C08K 5/06* (2013.01); *C08K 5/5419* (2013.01); *C09D 125/14* (2013.01); *B01F 17/0021* (2013.01); *B01F 17/0028* (2013.01); *B01F 17/0071* (2013.01); *C08L 2205/03* (2013.01); *H01L 21/02205* (2013.01)

(58) Field of Classification Search
  CPC ............ C09D 129/04; H01L 21/02205; B01F 17/0021; B01F 17/0028; B01F 17/0071
  See application file for complete search history.

(56) References Cited

U.S. PATENT DOCUMENTS

| 4,339,553 A | 7/1982 | Yoshimura et al. |
| 4,970,098 A | 11/1990 | Ayala-Esquilin et al. |
| (Continued) | | |

FOREIGN PATENT DOCUMENTS

| EP | 2228690 A1 | 9/2010 |
| WO | 2005047385 A1 | 5/2005 |

OTHER PUBLICATIONS

"Dimer Acids," Kirk-Othmer Encyclopedia of Chemical Technology, vol. 8, 4th Ed. (1992), pp. 223-237.
(Continued)

*Primary Examiner* — Michael A Salvitti
(74) *Attorney, Agent, or Firm* — MH2 Technology Law Group LLP (57) ABSTRACT

A method of making a sacrificial coating composition is disclosed. The method comprises emulsifying an oil with surfactant to form an oil-in-water emulsion; and combining ingredients comprising (i) at least one polymer, (ii) at least one hygroscopic material, (iii) the oil-in water emulsion and (iv) water to produce the sacrificial coating composition. The at least one polymer is selected from the group consisting of a hydrophilic polymer, a latex comprising polymer particles dispersed in a continuous liquid phase, or mixtures thereof.

13 Claims, 8 Drawing Sheets

(51) Int. Cl.

| | | |
|---|---|---|
| C08K 5/06 | (2006.01) | |
| C08K 5/053 | (2006.01) | |
| C08K 5/5419 | (2006.01) | |
| H01L 21/02 | (2006.01) | |
| B01F 17/54 | (2006.01) | |
| B01F 17/00 | (2006.01) | |

(56) References Cited

U.S. PATENT DOCUMENTS

| | | | |
|---|---|---|---|
| 4,997,642 A * | 3/1991 | Curtis et al. | 514/521 |
| 5,145,518 A | 9/1992 | Winnik et al. | |
| 5,146,087 A | 9/1992 | Vandusen | |
| 5,202,265 A | 4/1993 | LaMora | |
| 5,208,630 A | 5/1993 | Goodbrand et al. | |
| 5,225,900 A | 7/1993 | Wright | |
| 5,231,135 A | 7/1993 | Machell et al. | |
| 5,256,193 A | 10/1993 | Winnik et al. | |
| 5,271,764 A | 12/1993 | Winnik et al. | |
| 5,275,647 A | 1/1994 | Winnik | |
| 5,286,286 A | 2/1994 | Winnik et al. | |
| 5,301,044 A | 4/1994 | Wright | |
| 5,378,574 A | 1/1995 | Winnik et al. | |
| 5,385,803 A | 1/1995 | Duff et al. | |
| 5,464,703 A | 11/1995 | Ferrar et al. | |
| 5,474,852 A | 12/1995 | Fitzgerald et al. | |
| 5,494,702 A | 2/1996 | Blaine et al. | |
| 5,539,038 A | 7/1996 | Katsen et al. | |
| 5,543,177 A | 8/1996 | Morrison et al. | |
| 5,547,759 A | 8/1996 | Chen et al. | |
| 5,554,480 A | 9/1996 | Patel et al. | |
| 5,593,807 A | 1/1997 | Sacripante et al. | |
| 5,621,022 A | 4/1997 | Jaeger et al. | |
| 5,629,416 A | 5/1997 | Neigel et al. | |
| 5,695,878 A | 12/1997 | Badesha et al. | |
| 5,700,568 A | 12/1997 | Badesha et al. | |
| 5,736,520 A | 4/1998 | Bey et al. | |
| 5,744,200 A | 4/1998 | Badesha et al. | |
| 5,750,204 A | 5/1998 | Badesha et al. | |
| 5,753,307 A | 5/1998 | Badesha et al. | |
| 5,808,645 A | 9/1998 | Reeves et al. | |
| 5,841,456 A | 11/1998 | Takei et al. | |
| 5,945,245 A | 8/1999 | Mychajlowskij et al. | |
| 6,020,300 A * | 2/2000 | Tcheou et al. | 510/417 |
| 6,042,227 A | 3/2000 | Meinhardt et al. | |
| 6,051,562 A * | 4/2000 | Chamberlain et al. | 514/89 |
| 6,103,815 A | 8/2000 | Mammino et al. | |
| 6,156,858 A | 12/2000 | Keoshkerian et al. | |
| 6,221,137 B1 | 4/2001 | King et al. | |
| 6,348,509 B1 * | 2/2002 | Reeve | 516/180 |
| 6,586,100 B1 | 7/2003 | Pickering et al. | |
| 7,172,276 B2 | 2/2007 | Breton et al. | |
| 7,202,883 B2 | 4/2007 | Breton et al. | |
| 7,281,790 B2 | 10/2007 | Mouri et al. | |
| 7,294,377 B2 | 11/2007 | Gervasi et al. | |
| 7,374,812 B2 | 5/2008 | Mizuno | |
| 7,608,325 B2 | 10/2009 | Rasch et al. | |
| 7,767,011 B2 | 8/2010 | Bedford et al. | |
| 7,780,286 B2 | 8/2010 | Yahiro | |
| 8,038,284 B2 | 10/2011 | Hori et al. | |
| 8,136,936 B2 | 3/2012 | Hook et al. | |
| 8,142,557 B2 | 3/2012 | Belelie et al. | |
| 8,215,762 B2 | 7/2012 | Ageishi | |
| 8,247,066 B2 | 8/2012 | Wu | |
| 8,268,399 B2 | 9/2012 | Gervasi et al. | |
| 8,350,879 B2 | 1/2013 | Larson et al. | |
| 8,500,269 B2 | 8/2013 | Morita | |
| 8,919,252 B2 | 12/2014 | Lestrange et al. | |
| 9,011,594 B1 | 4/2015 | Kanungo et al. | |
| 9,022,546 B1 | 5/2015 | Breton et al. | |
| 9,126,430 B2 | 9/2015 | Liu | |
| 9,138,985 B1 * | 9/2015 | Yang et al. | |
| 9,174,432 B2 | 11/2015 | Liu et al. | |
| 9,187,587 B2 | 11/2015 | Kanungo et al. | |
| 9,193,209 B2 | 11/2015 | Dooley et al. | |
| 9,211,697 B2 | 12/2015 | Dooley et al. | |
| 9,227,393 B2 | 1/2016 | Song et al. | |
| 9,259,915 B2 | 2/2016 | Dooley et al. | |
| 9,273,218 B2 | 3/2016 | Liu | |
| 9,284,469 B2 | 3/2016 | Song et al. | |
| 9,303,135 B2 | 4/2016 | Eliyahu et al. | |
| 9,303,185 B2 | 4/2016 | Sambhy et al. | |
| 9,327,519 B1 | 5/2016 | Larson et al. | |
| 9,353,290 B2 | 5/2016 | Condello et al. | |
| 2002/0064648 A1 | 5/2002 | Schlueter et al. | |
| 2003/0067528 A1 | 4/2003 | Chowdry et al. | |
| 2003/0233952 A1 | 12/2003 | Pan et al. | |
| 2003/0233953 A1 | 12/2003 | Pan et al. | |
| 2003/0234840 A1 | 12/2003 | Pan et al. | |
| 2004/0158056 A1 | 8/2004 | Hiemstra et al. | |
| 2004/0253436 A1 | 12/2004 | Heeks et al. | |
| 2005/0018027 A1 | 1/2005 | Pan et al. | |
| 2006/0008599 A1 | 1/2006 | Hiyama | |
| 2006/0105117 A1 | 5/2006 | Kim et al. | |
| 2006/0152566 A1 | 7/2006 | Taniuchi et al. | |
| 2007/0207186 A1 | 9/2007 | Scanlon et al. | |
| 2007/0207269 A1 | 9/2007 | Woodhall et al. | |
| 2008/0032072 A1 | 2/2008 | Taniuchi et al. | |
| 2008/0055381 A1 | 3/2008 | Doi et al. | |
| 2008/0206571 A1 | 8/2008 | Berckmans et al. | |
| 2009/0110942 A1 | 4/2009 | Henderson-Rutgers et al. | |
| 2009/0152664 A1 | 6/2009 | Klem et al. | |
| 2009/0237479 A1 | 9/2009 | Yamashita et al. | |
| 2011/0018925 A1 | 1/2011 | Ohara | |
| 2011/0025752 A1 | 2/2011 | Law et al. | |
| 2011/0122195 A1 | 5/2011 | Kovacs et al. | |
| 2011/0122210 A1 | 5/2011 | Sambhy et al. | |
| 2011/0269849 A1 * | 11/2011 | Yao | 514/773 |
| 2012/0039648 A1 | 2/2012 | Sambhy et al. | |
| 2012/0042518 A1 | 2/2012 | Law et al. | |
| 2012/0083530 A1 * | 4/2012 | Mai et al. | 514/560 |
| 2012/0103212 A1 | 5/2012 | Stowe et al. | |
| 2012/0135650 A1 | 5/2012 | Servante et al. | |
| 2012/0140009 A1 | 6/2012 | Kanasugi et al. | |
| 2012/0162312 A1 | 6/2012 | Ahl et al. | |
| 2012/0251685 A1 * | 10/2012 | Wang-Nolan et al. | 426/250 |
| 2012/0274914 A1 | 11/2012 | Stowe et al. | |
| 2012/0283098 A1 * | 11/2012 | Zhang et al. | 504/128 |
| 2012/0301818 A1 | 11/2012 | Gilmartin et al. | |
| 2013/0266803 A1 | 10/2013 | Dooley et al. | |
| 2013/0272763 A1 | 10/2013 | Moorlag et al. | |
| 2014/0060352 A1 | 3/2014 | Gervasi et al. | |
| 2014/0060357 A1 | 3/2014 | Hsieh | |
| 2014/0060359 A1 | 3/2014 | Kanungo et al. | |
| 2014/0060360 A1 | 3/2014 | Moorlag et al. | |
| 2014/0060361 A1 | 3/2014 | Gervasi et al. | |
| 2014/0060363 A1 | 3/2014 | Kelly et al. | |
| 2014/0060365 A1 | 3/2014 | Gervasi et al. | |
| 2014/0154377 A1 * | 6/2014 | Wang-Nolan et al. | 426/271 |
| 2014/0168330 A1 * | 6/2014 | Liu et al. | 347/95 |
| 2014/0307800 A1 | 10/2014 | Condello et al. | |
| 2015/0004861 A1 | 1/2015 | Gervasi et al. | |
| 2015/0022602 A1 | 1/2015 | Landa et al. | |
| 2015/0085036 A1 | 3/2015 | Liu | |
| 2015/0085039 A1 | 3/2015 | Liu | |
| 2015/0116414 A1 | 4/2015 | Eliyahu et al. | |
| 2015/0119510 A1 | 4/2015 | Eliyahu et al. | |
| 2015/0165758 A1 | 6/2015 | Sambhy et al. | |
| 2015/0258778 A1 | 9/2015 | Dooley et al. | |
| 2015/0267078 A1 | 9/2015 | Dooley | |
| 2015/0275022 A1 | 10/2015 | Chen et al. | |
| 2015/0291847 A1 | 10/2015 | Condello et al. | |
| 2015/0315403 A1 * | 11/2015 | Song et al. | 514/521 |
| 2015/0315409 A1 * | 11/2015 | Song et al. | 514/521 |
| 2015/0343797 A1 | 12/2015 | Song et al. | |
| 2016/0083606 A1 | 3/2016 | Sisler et al. | |
| 2016/0083609 A1 | 3/2016 | Sisler et al. | |
| 2016/0083636 A1 | 3/2016 | Yoshida et al. | |
| 2016/0089875 A1 | 3/2016 | Song et al. | |
| 2016/0176185 A1 | 6/2016 | Kanungo et al. | |

OTHER PUBLICATIONS

Author Unknown, "Chemical reactions on the "finished" silicone", Silicones Europe, http://www.silicones.eu/science-research/chemis- (56) References Cited

OTHER PUBLICATIONS try/chemical-reactions-on-the-finished-silicone, accessed Dec. 13, 2014, pp. 1-4.
Bruce E Kahn, "The M3D Aerosol Jet System, An Alternative to Inkjet Printing for Printed Electronics", Organic and Printed Electronics, vol. 1, Issue 1, Winter 2007, pp. 14-17.
Jikei et al. "Synthesis and Properties of Hyperbranched Aromatic Polyamide Copolymers from AB and AB2 Monomers by Direct Polycondensation", Macromolecules 2000, 33, pp. 6228-6234 (2000).
Song, et al., "Compositions and Use of Compositions in Printing Processes", U.S Appl. No. 14/502,202, filed Sep. 30, 2014.
Kanungo, et al., "Multilayer Imaging Blanket Coating", U.S. Appl. No. 14/576,734, filed Dec. 19, 2014.
Song, et al "Sacrificial Coating and Indirect Printing Apparatus Employing Sacrificial Coating on Intermediate Transfer Member", U.S. Appl. No. 14/665,319, filed Mar. 23, 2015.
Larson, et al., "Sacrificial Coating and Indirect Printing Apparatus Employing Sacrificial Coating on Intermediate Transfer Member", U.S. Appl. No. 14/830,557, filed Aug. 19, 2015.
Larson, et al., "Sacrificial Coating and Indirect Printing Apparatus Employing Sacrificial Coating on Intermediate Transfer Member", U.S. Appl. No. 14/867,864, filed Sep. 28, 2015.
http://www2.dupont.com/Elvanol/en_US/assets/downloads/elvanol_51_05.pdf, 2006.
DOW, DOW Surfacants, http://www.dow.com/surfacants/products/second.htm, retrieved Mar. 10, 2014, pp. 1-2.
Dow, Material Safety Data Sheet, TERGITOL(TM) TMN-6 (90% AQ), The Dow Chemical Company, Feb. 12, 2003, pp. 1-15.
DOW, Product Safety Assessment, TRITON CF Series Surfactants, Dec. 16, 2012, 6 pages.
Nikipedia, Hydrocarbon, Downloaded Mar. 2, 2016, 8 pages.
Reddy et al., "Citric acid cross-linking of starch films," University of Nebraska—Lincoln, Faculty Publications—Textiles, Merchandising and Fashion Design, Paper 25, 2009, pp. 702-711.
Wikipedia, "Tricarboxylic Acid," 2 pages printed on Aug. 19, 2015.
Wikipedia, "Dicarboxylic Acid," 7 pages printed on Aug. 19, 2015.
Wikipedia, "Tetracarboxylic acids", 2 pages printed on Aug. 19, 2015, https://commons.wikimedia.org/wiki/Category:Tetracarboxylic_acids.
Author Unknown, Byk-Silclean 3700 by BYK Chemie, http://www.specialchem4coatings.com/tds/byk-silclean-3700/byk-chemie/10414/index.aspx?q=Byk%20Silclean%203700, 2013, 1 page.
Author Unknown, Desmodur N 3790 BA, Bayer MaterialScience, LLC., http://www.bayermaterialsciencenafta.com/products/index.cfm?mode=lit&pp_num=EB7C52DD-F4EC-BDA1-6BE0225FEE5C1FD0&pg_num=EB7C5520-9065-98A0-5A4CD71113D57191&pf=0&pf=1, 2007, 1 page.
Author Unknown, "Dot Tool", Quality Engineering Associates, Inc., pp. 1-3.
Author Unknown, "Products and Properties: Desmodur/Desmophen for Coatings, Commercial Products", Bayer MaterialScience AG brochure, Edition: Jul. 2005 E, 28 pages.
Berset 2185, Technical Data Sheet, Mar. 14, 2012, 2 pages.
Cabot, "Speciatly Carbon Blacks for Ultraviolet Protection & Weatherability", Cabot Corporation, 2 pages.
Law et al., "Self Cleaning Polymers and Surfaces", TechConnect World Conference & Expo, Jun. 13-16, 2011, abstract of presentation, 1 page.
Ming-Kai Tse, "PIAS-II TM—A Hig-performance Portable tool for Print Quality Analysis Anytime, Anywhere", Quality Engineering Associates (QEA), Inc. pp. 1-4.
Philipp, et al., "Three Methods for In Situ Cross-Linking of Polyvinyl Alcohol Films for Application as Ion-Conducting Membranes in Potassium Hydroxide Electrolyte", NASA, Apr. 1979, 18 pages.
Song, "Starch crosslinking for cellulose fiber modification and starch nanoparticle formation", https://smarttech.gatech.edu/handle/1853/39524?show=full, downloaded Jan. 22, 2015, 4 pages.
Wang, et al., "Preparation of a Crosslinking Cassava Starch Adhesive and its Application in Coating Paper", BioResources, 2013, 8 (3), pp. 3574-3589.
Bruce E. Kahn, "The M3D Aerosol Jet System, An Alternative to Inkjet Printing for Printed Electronics", Organic and Printed Electronics, vol. 1, Issue 1, Winter 2007, pp. 14-17.
Jikei et al., "Synthesis and Properties of Hyperbranched Aromatic Polyamide Copolymers from AB and AB2 Monomers by Direct Polycondensation", Macromolecules 2000, 33, pp. 6228-6234.

\* cited by examiner

| SAMPLE / TRANSFER TEMPERATURE | EXAMPLE 2A<br>0.25% Tergitol TMN-6<br>with AK500 OIL<br>(TMN:Oil Ratio=90:10) | | EXAMPLE 2B<br>0.25% Tergitol TMN-6 | |
|---|---|---|---|---|
| | BLANKET | INK TRANSFER ONTO DCEG PAPER | BLANKET | INK TRANSFER ONTO DCEG PAPER |
| 100°C | | | | |
| 110°C | | | | |

METHOD OF MAKING SACRIFICIAL COATING FOR AN INTERMEDIATE TRANSFER MEMBER OF INDIRECT PRINTING APPARATUS

DETAILED DESCRIPTION

Field of the Disclosure

This disclosure relates generally to a method of making a sacrificial coating for use on an intermediate transfer member of an inkjet printer.

Background

In aqueous ink indirect printing, an aqueous ink is jetted on to an intermediate imaging surface (sometimes referred to herein as an intermediate transfer member), which can be, for example, in the form of a blanket. The ink is partially dried on the blanket prior to transfixing the image to a media substrate, such as a sheet of paper. To ensure excellent print quality it is desirable that the ink drops jetted onto the blanket spread and become well-coalesced prior to drying. Otherwise, the ink images appear grainy and have deletions. Lack of spreading can also cause missing or failed inkjets in the printheads to produce streaks in the ink image. Spreading of aqueous ink is facilitated by materials having a high energy surface.

In order to facilitate transfer of the ink image from the blanket to the media substrate after the ink is dried on the intermediate imaging surface, a blanket having a surface with a relatively low surface energy is preferred. Rather than providing the desired spreading of ink, low surface energy materials tend to promote "beading" of individual ink drops on the image receiving surface.

Thus, an optimum blanket for an indirect image transfer process must tackle both the challenges of wet image quality, including desired spreading and coalescing of the wet ink; and the image transfer of the dried ink. The first challenge, wet image quality, prefers a high surface energy blanket that causes the aqueous ink to spread and wet the surface. The second challenge, image transfer, prefers a low surface energy blanket so that the ink, once partially dried, has minimal attraction to the blanket surface and can be transferred to the media substrate.

Various approaches have been investigated to provide a solution that balances the above challenges. These approaches include blanket material selection, ink design and auxiliary fluid methods. With respect to material selection, materials that are known to provide optimum release properties include the classes of silicone, fluorosilicone, a fluoropolymer, such as TEFLON or VITON, and certain hybrid materials. These materials have low surface energy, but provide poor wetting. Alternatively, polyurethane and polyimide have been used to improve wetting, but at the cost of ink release properties. Tuning ink compositions to address these challenges has proven to be very difficult since the primary performance attribute of the ink is the performance in the print head. For instance, if the ink surface tension is too high it will not jet properly and it if is too low it will drool out of the face plate of the print head.

Identifying and developing new techniques and/or materials that improve wet image quality and/or image transfer would be considered a welcome advance in the art.

SUMMARY

An embodiment of the present disclosure is directed to a method of making a sacrificial coating composition. The method comprises emulsifying an oil with surfactant to form an oil-in-water emulsion; and combining ingredients comprising (i) at least one polymer, (ii) at least one hygroscopic material, (iii) the oil-in water emulsion and (iv) water to produce the sacrificial coating composition. The at least one polymer is selected from the group consisting of a hydrophilic polymer, a latex comprising polymer particles dispersed in a continuous liquid phase, or mixtures thereof.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawings that form a part thereof, and in which is shown by way of illustration a specific exemplary embodiment in which the present teachings may be practiced. The following description is, therefore, merely exemplary.

As used herein, the terms "printer," "printing device," or "imaging device" generally refer to a device that produces an image on print media with aqueous ink and may encompass any such apparatus, such as a digital copier, bookmaking machine, facsimile machine, multi-function machine, or the like, which generates printed images for any purpose. Image data generally include information in electronic form which are rendered and used to operate the inkjet ejectors to form an ink image on the print media. These data can include text, graphics, pictures, and the like. The operation of producing images with colorants on print media, for example, graphics, text, photographs, and the like, is generally referred to herein as printing or marking. Aqueous inkjet printers use inks that have a high percentage of water relative to the amount of colorant and/or liquid vehicle in the ink.

The term "printhead" as used herein refers to a component in the printer that is configured with inkjet ejectors to eject ink drops onto an image receiving surface. A typical printhead includes a plurality of inkjet ejectors that eject ink drops of one or more ink colors onto the image receiving surface in response to firing signals that operate actuators in the inkjet ejectors. The inkjets are arranged in an array of one or more rows and columns. In some embodiments, the inkjets are arranged in staggered diagonal rows across a face of the printhead. Various printer embodiments include one or more printheads that form ink images on an image receiving surface. Some printer embodiments include a plurality of printheads arranged in a print zone. An image receiving surface, such as an intermediate imaging surface, moves past the printheads in a process direction through the print zone. The inkjets in the printheads eject ink drops in rows in a cross-process direction, which is perpendicular to the process direction across the image receiving surface.

As used in this document, the term "aqueous ink" includes liquid inks in which colorant is in a solution, suspension or dispersion with a liquid vehicle that includes water and/or one or more liquid vehicles. The term "liquid vehicle" is defined herein to include both liquid solvents that may dissolve a solute into a solution and liquid carriers that hold particles in a suspension or dispersion without dissolving the particle.

As used herein, the term "hydrophilic" refers to any composition or compound that attracts water molecules or other solvents or liquid carriers used in aqueous ink. As used herein, a reference to a hydrophilic composition refers to a liquid vehicle that carries a hydrophilic agent. Examples of liquid vehicles include, but are not limited to a liquid, such as water or alcohol, that carries a dispersion, suspension, or solution.

As used herein, a reference to a dried layer or dried coating refers to an arrangement of a hydrophilic compound after all or a substantial portion of the liquid vehicle has been removed from the composition through a drying process. As described in more detail below, an indirect inkjet printer forms a layer of a hydrophilic composition on a surface of an intermediate transfer member using a liquid vehicle, such as water, to apply a layer of the hydrophilic composition. The liquid vehicle is used as a mechanism to convey the hydrophilic composition to an image receiving surface to form a uniform layer of the hydrophilic composition on the image receiving surface.

Sacrificial Coating Composition

An embodiment of the present disclosure is directed to a sacrificial coating composition formed on an intermediate transfer member of an indirect printing apparatus. The sacrificial coating composition is made from ingredients comprising at least one polymer selected from the group consisting of a hydrophilic polymer and a latex comprising polymer particles dispersed in a continuous liquid phase. Additional ingredients comprise at least one hygroscopic material; at least one oil-in-water emulsion; and water. As will be discussed further below, the oil-in-water emulsion is prepared by emulsifying an oil with a surfactant. The oil-in-water emulsion is combined with the polymer and other ingredients to produce the sacrificial coating composition.

Hydrophilic Polymers

Hydrophilic polymers can act as a binder in the compositions of the present disclosure. In an embodiment, the hydrophilic polymers are water soluble. For example, the hydrophilic polymers can be water soluble at temperatures below 100° C.

In an embodiment, the at least one hydrophilic polymer is selected from the group consisting of polyvinyl alcohol, a copolymer of vinyl alcohol and alkene monomers, poly (vinylpyrrolidinone) (PVP), poly(ethylene oxide), hydroxyethyl cellulose, cellulose acetate, poly(ethylene glycol), copolymers of poly(ethylene glycol), polyacrylamide (PAM), poly(N-isopropylacrylamide) (PNIPAM), poly (acrylic acid), polymethacrylate, acrylic polymers, maleic anhydride copolymers, sulfonated polyesters, polysaccharides, waxy maize starches and mixtures thereof. In an embodiment, the hydrophilic polymer is selected from waxy maize starches comprising more than 90 weight percent amylopectin, such as 93 or 95 weight percent amylopectin or more, relative to the total weight of the waxy maize.

In an embodiment, the at least one hydrophilic polymer is polyvinyl alcohol. In an embodiment, the at least one polymer is a copolymer of polyvinyl alcohol and alkene monomers. Examples of suitable polyvinyl alcohol copolymers include poly(vinyl alcohol-co-ethylene). In an embodiment, the poly(vinyl alcohol-co-ethylene) has an ethylene content ranging from about 5 mol % to about 30 mol %. Other examples of polyvinyl copolymer include poly(acrylic acid)-poly(vinyl alcohol) copolymer, polyvinyl alcohol-acrylic acid-methyl methacrylate copolymer, poly(vinyl alcohol-co-aspartic acid) copolymer etc.

It is well known that PVOH can be manufactured by hydrolysis of polyvinyl acetate to form, for example, partially hydrolyzed (87-89%), intermediate hydrolyzed (91-95%), fully hydrolyzed (98-98.8%) to super hydrolyzed (more than 99.3%) polyvinyl alcohol. In an embodiment, the polyvinyl alcohol employed in the compositions of the present disclosure has a hydrolysis degree ranging from about 75% to about 99.5% or 99.3%, such as about 80% to about 95%, or about 85% to about 90%.

The polyvinyl alcohol or copolymer thereof can have any suitable molecular weight. In an embodiment, the weight average molecular weight ranges from about 8000 to about 30,000 g-mole$^{-1}$, such as from about 10,000 to about 25,000 g-mole$^{-1}$, or from about 13,000 to about 23,000 g-mole$^{-1}$.

In an embodiment, the polyvinyl alcohol can provide a suitable viscosity for forming a sacrificial coating on an intermediate transfer member. For example, at about 4% by weight polyvinyl alcohol in a solution of DI water, at 20° C. the viscosity can range from about 2 cps to about 100 cps, such as about 3 cps to about 15 or 30 cps, or about 3 cps to about 5 cps, where the % by weight is relative to the total weight of polyvinyl alcohol and water.

Polyvinyl alcohol is a hydrophilic polymer and has good water retention properties. As a hydrophilic polymer, the coating film formed from polyvinyl alcohol can exhibit good water retention properties, which can assist the ink spreading on the blanket. Because of its superior strength, the coatings formulated with polyvinyl alcohol can achieve a significant reduction in total solid loading level. This may provide substantial cost savings while providing a significant improvement of the coating film performance. In addition, the shelf life of PVOH based formulations can be relatively long compared to some polymers, such as starches. The mechanical properties of polyvinyl alcohol can be significantly better when compared to starches.

The chemical structure of the hydrophilic polymer containing coating can be tailored to fine-tune the wettability and release characteristics of the sacrificial coating from the underlying ITM surface. This can be accomplished by employing one or more hygroscopic materials and one or more surfactants in the coating composition.

Latex

The at least one polymer can be supplied in the form of a latex comprising polymer particles dispersed in a continuous liquid phase. The polymer particles comprise one or more repeating polymeric units. In an embodiment, the polymeric units are selected from the group consisting of acrylic acid units, acrylate units, methacrylic acid units, methacrylate units, diene units, aliphatic nitrile units, vinyl ether units, vinyl ester units, vinyl ketone units, vinylidene halide units, vinyl substituted heterocyclic amine units, acrylamide units, methacrylamide units, vinyl substituted aromatic hydrocarbon units, vinyl halide units and alkene units. In an embodiment, the polymer particles comprise a polyvinyl acetate copolymer. In an embodiment, the latex is an acrylic latex, such as a latex comprising one or more acrylic resins made from at least one monomer selected from the group consisting of methyl acrylate, ethyl acrylate, butyl acrylate, methacrylic acid and acrylic acid. In an embodiment, the latex polymer particles comprise one or more repeating polymeric units selected from the group consisting of n-butyl acrylate units, methacrylic acid units, methyl methacrylate units, styrene units and butadiene units. In an embodiment, the latex is a styrene/n-butyl acrylate/methacrylic acid terpolymer, examples of which are disclosed in co-pending U.S. patent application Ser. No. 14/288,633, filed on May 28, 2014, the disclosure of which is incorporated herein by reference in its entirety. Examples of suitable latexes can include well known latexes such as Styrene/n-butyl acrylate latex, which has been commercially used, for example, in aqueous overcoats in post finishing processes.

The monomers and amounts of monomers employed in the latex can be adjusted to provide desired properties for the transfix process. For instance, acrylic latex and/or styrene butadiene latex can be employed with different methacrylic acid (MAA) loadings to alter the properties of the latex. In one example, different methacrylic acid loadings were employed for different styrene to n-butyl acrylate ratios to provide very different glass transition temperatures and softening points. An example of loading of methacrylic acid relative to styrene and n-butyl acrylate in these latexes ranges from about 2 to about 20 wt %, such as about 5 wt %, 10 wt % or 15 wt %, relative to the total weight of the methacrylic acid, styrene and n-butyl acrylate monomers.

The latexes can have any suitable solids content. Examples of suitable solids content include ranges from about 5% to about 60% by weight, such as about 10% to about 50% by weight, or about 20% to about 40% by weight, relative to the total weight of the liquid coating composition.

The latex polymer can have any suitable molecular weight. Examples of suitable weight average molecular weight, Mw, range from about 3000 to about 300,000, such as about 5,000 to 100,000, or about 5,000 to about 60,000. Examples of suitable number average molecular weight, Mn, range from about 1,000 to about 30,000, such as about 2,000 to 20,000, or about 5,000 to about 15,000.

Latex properties can be adjusted to provide any desired properties suitable for the aqueous transfix printing process. For example, the Tg of the latex can range from about −45° C. to about 100° C., such as about −35° C. to 85° C., or about −25° C. to about 55° C. In an example, the viscosity of the latex is from about 3 cps to 800 cps at 25° C. In an example, the pH of the latex ranges from about 1.5 to about 10, such as about 3 to about 8. In an example, the softening point of the latex ranges from about 100° C. to about 170° C.

In an example, the D50 particle size of the latex ranges from about 20 to about 200 nm and the particle size distribution ranges from about 5 nm to 300 nm, such as about 50 to about 250 nm. The gel content (insoluble portion in toluene) in the latex ranges, for example, from 0 to about 20.0%.

The chemical structure of the latex containing coating can be tailored to fine-tune the wettability and release characteristics of the sacrificial coating from the underlying ITM surface. This can be accomplished by employing one or more hygroscopic materials and one or more surfactants in the coating composition.

Hygroscopic Material

Any suitable hygroscopic material can be employed. The hygroscopic material can be functionalized as a plasticizer. In an embodiment, the at least one hygroscopic material is selected from the group consisting of glycerol, sorbitol, glycols such as polyethylene glycol, vinyl alcohols, xylitol, maltitol, polymeric polyols, glyceryl triacetate, glycouril, ionic liquids and mixtures thereof. A single hygroscopic material can be used. Alternatively, multiple hygroscopic materials, such as two, three or more hygroscopic materials, can be used.

Oil-in-Water Emulsion

The addition of an oil-in-water emulsion to the undercoat formulation can further improve the ink transfer efficiency during the transfix process. In an embodiment, the oil-in-water emulsion includes a surfactant. Any suitable oil and surfactant combination that will provide the desired improvement in ink transfer efficiency can be employed.

Examples of oils include silicone oils, perfluoroether oils, hydrocarbon oils and mixtures thereof. In an embodiment, the oil is mineral oil selected from the group consisting of paraffinic oils, naphthenic oils, aromatic oils and mixtures thereof. Oil viscosity can range, for example, from about 10 cps to about 1000 cps, such as about 100 cps to about 900 cps, or about 200 cps to about 800 cps. In an embodiment, the viscosity of silicone oil is less than 1000 centipoises.

Any suitable surfactants can be employed. In an embodiment, the at least one surfactant is nonionic surfactant having a hydrophile lipophile balance ("HLB") value ranging from about 4 to about 15, such as, for example about 8 to about 14. A single surfactant can be used. Alternatively, multiple surfactants, such as two, three or more surfactants, can be used. For example, the surfactant can comprise a mixture of a first surfactant and a second surfactant, the first surfactant having an HLB value ranging from about 8 or 10 to about 14 or 15 and the second surfactant having an HLB value ranging from about 4 to about 8 or 10, the first surfactant having a higher HLB value than the second surfactant.

In an embodiment, the surfactant can be a nonionic linear or branched alcohol ethoxylate compound of general formula $RO(CH_2CH_2O)_xH$, where R is an alkyl group ranging from $C_6$ to $C_{18}$ and x is a positive integer ranging from 1 to 15. Other examples of suitable surfactants include polyethylene glycol and polyethylene glycol trimethylnonyl ether. Examples of nonionic surfactants include secondary alcohol ethoxylates such as the Tergitol® 15-S series supplied by Dow Chemical Company. In an embodiment, the surfactants are branched secondary alcohol ethoxylates such as a branched secondary alcohol ethoxylate with 6 to 12 moles of ethylene oxide (EO). Examples of suitable commercially available surfactants include the Tergitol® TMN series also supplied by Dow Chemical Company, such as Tergitol TMN-6, a branched secondary alcohol ethoxylate and Tergitol 15-s-7, a secondary alcohol ethoxylate. Formula 1 below is a general formula for the Tergitol series. Surfactants of formula 1 could have any suitable value for n, such as, for example, 1 to 15, or 6 to 12. For TMN-6 the valued of n is about 8. TMN-10 and TMN-100 are also potential candidates, which values for n of about 11 and 10, respectively.

Formula 1

Tergitol®
TMN-6 (n~8)
TMN-10 (n~11)
TMN-100 (n~10)

In an embodiment, the cloud point for the alcohol ethoxylate is above 30° C. Any other suitable surfactants can also be employed.

Additional Ingredients

The coating composition can optionally include one or more fillers or additives. Fillers and additives can be selected to improve robustness of the sacrificial coating, among other things. Examples of suitable fillers include metal oxide particles, such as colloidal silica or nano-aluminum oxide. Other optional additives include, for example, silicone, biocides and additional solvents and/or liquid carriers. Examples of biocides include ACTICIDES® CT, ACTICIDES® LA 1209 and ACTICIDES® MBS from about 0.001 weight percent to about 0.2 weight percent of the active ingredient. Examples of suitable liquid vehicles include isopropanol and MEK (methyl ethyl ketone) or combinations thereof in water.

Method of Making the Sacrificial Coating Composition

Figure 1:
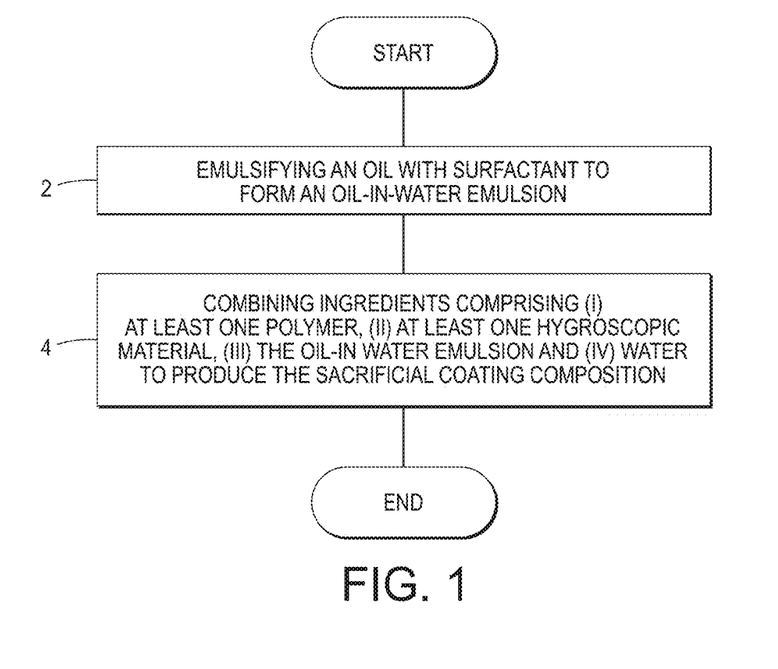
FIG. 1 is a flow charge of a method of making a sacrificial coating composition, according to an embodiment of the present disclosure.

FIG. 1 illustrates a flow chart of a method of making an aqueous undercoat composition, according to an embodiment of the present disclosure. As shown at block 2 of FIG. 1, the method comprises emulsifying an oil with surfactant to form an oil-in-water emulsion. Any suitable method for forming a stable emulsion can be employed. For example, the mixing of the oil and surfactant can occur at a sufficiently high shear for a suitable period of time to form micro-sized or other suitably sized droplets of the oil dispersed in the surfactant continuous phase. In an embodiment, the mixing of the oil and surfactant occurs at a high shear speed of at least 6000 RPM, such as 6500 RPM or 7000 RPM or more.

Improvements in transfer efficiency of the undercoat formulation are observed when the oil-in-water emulsion is employed. The emulsification and formulation process described herein produces a formulation which is stable towards phase separation over an extended time period, such as, for example, several days, a week or longer.

If the formulation is not stable towards phase-separation, little or no improvements in transfer efficiency have been observed. Simple addition of oil to the original formulation does not result in a sufficiently stable formulation. If oil is added to the formulation directly, rather than as an emulsion, the oil phase separates from the aqueous solution and will not be present in the intermediate thin film (skin) to aid with transfer.

Any suitable amount of oil can be employed in the emulsion. For example, the oil can be loaded in the surfactant at a concentration ranging from about 0.1 wt % to about 15 wt % relative to the combined weight of the oil and surfactant, such as about 1 wt % to about 10 wt %, or about 3 wt % to about 5 wt %.

Referring to block 4 of FIG. 1, the method further comprises combining ingredients comprising (i) at least one polymer, (ii) at least one hygroscopic material, (iii) the oil-in-water emulsion and (iv) water to produce the sacrificial coating composition. The ingredients can be combined with the oil-in-water emulsion in any suitable order. In an embodiment, the at least one polymer, at least one hygroscopic material, and water are combined prior to addition of the oil-in-water emulsion. Alternatively, the at least one polymer and water are combined prior to addition of the oil-in-water emulsion, which is added simultaneously with or prior to the at least one hygroscopic material.

Any of the polymers and hygroscopic materials described herein for forming the sacrificial layer can be employed. In an embodiment, any of the hydrophilic polymers described herein can be employed. In an embodiment, the at least one polymer is selected from the group consisting of polyvinyl alcohol ("PVA") or a copolymer of vinyl alcohol and alkene monomers, as described in detail above.

Where the least one polymer is a hydrophilic polymer, the polymer can be heated sufficiently in water to dissolve the polymer. In an embodiment, the hydrophilic polymers are dissolved in water prior to mixing with the oil-in-water emulsion. For example, PVA and copolymers thereof taught herein are often solid at room temperature, and can be dissolved in hot water. In an embodiment, the other water soluble polymers taught herein can also be dissolved in water at suitably high temperatures. The heating can occur at any suitable temperature and for any suitable period of time sufficient to dissolve the polymer. In an embodiment, the heating can be carried out at a temperature of at least about 80° C., such as about 85 to about 98° C., or about 90 to about 93° C. For example, the method can comprise heating polyvinyl alcohol to a temperature of at least about 80° C. for a time ranging from about 30 minutes to about 90 minutes prior to combining ingredients to form the polymer mixture.

In an embodiment, the at least one polymer can be in the form of a latex comprising polymer particles dispersed in a continuous liquid phase. Any of the latexes discussed herein can be employed. As described above, the polymer particles can comprise one or more repeating polymeric units selected from the group consisting of acrylic acid units, acrylate units, methacrylic acid units, methacrylate units, diene units, aliphatic nitrile units, vinyl ether units, vinyl ester units, vinyl ketone units, vinylidene halide units, vinyl substituted heterocyclic amine units, acrylamide units, methacrylamide units, vinyl substituted aromatic hydrocarbon units, vinyl halide units and alkene units.

Any of the additional ingredients discussed herein can be employed. For example, the mixture can include one or more fillers, silicone, additional solvents, liquid carriers and biocides. These materials can be mixed into the composition in any suitable manner.

The total amount of water in the wet composition prior to coating can be any suitable amount. In an embodiment where the hydrophilic polymers of the present application are employed, the total amount of water can be, for example, 60% by weight or more, such as from about 70 to about 97% by weight, or about 80 to about 95% by weight, relative to the total weight of the composition. In an embodiment where a latex is employed, the total amount of water in the wet composition prior to coating can be, for example, 30% by weight or more, such as from about 40 to about 95% by weight, or about 45 to about 70% or 80% by weight, relative to the total weight of the composition.

The ingredients can be mixed in any suitable amounts. For example, if used, the hydrophilic polymer can be added in an amount of from about 0.5 to about 30 weight percent, or from about 1 to about 10 weight percent, or from about 1.5 to about 5 weight percent based upon the total weight of the coating mixture. If used, the latex can be added in an amount of from about 2 to about 50 weight percent, or from about 5 or 10 to about 40 weight percent, or from about 25 to about 35 weight percent based upon the total weight of the coating mixture. The surfactants can be present in an amount of from about 0.01 to about 4 weight percent, or from about 0.1 to about 2 weight percent, or from about 0.2 to about 0.5 or 1 weight percent, based upon the total weight of the coating mixture. The hygroscopic material can be present in an amount of from about 0.5 to about 30 weight percent, or from about 2 to about 25 weight percent, or from about 5 to about 20 weight percent, based upon the total weight of the coating mixture. In an embodiment, the amount of hydroscopic material present in a mixture with hydrophilic polymers can be in an amount of from about 0.5 to about 15 weight percent, or from about 2 to about 10 weight percent, or from about 3 to about 8 weight percent, based upon the total weight of the coating mixture. In an embodiment, the amount of hydroscopic material present in a mixture with latex polymers can be in an amount of from about 5 to about 30 weight percent, or from about 10 or 15 to about 20 or 25 weight percent, based upon the total weight of the coating mixture.

The compositions of the present disclosure can be used to form a sacrificial coating over any suitable substrate. Any suitable coating method can be employed, including, but not limited to, dip coating, spray coating, spin coating, flow coating, stamp printing, die extrusion coatings, flexo and gravure coating and/or blade techniques. In exemplary embodiments, suitable methods that can be employed to coat the liquid sacrificial coating composition on an intermediate transfer member include use of an anilox roller, as shown in FIG. 1, or an air atomization device such as an air brush or an automated air/liquid sprayer can be used for spray coating. In another example, a programmable dispenser can be used to apply the coating material to conduct a flow coating.

In an embodiment, the sacrificial coating composition is applied to the intermediate transfer member ("ITM"), where it is semi-dried or dried to form a film. The coating can have a higher surface energy and/or be more hydrophilic than the base ITM, which is usually a material with low surface free energy, such as, for example, a polysiloxane, such as polydimethylsiloxane or other silicone rubber material, fluorosilicone, TEFLON, polyimide or combinations thereof.

In embodiments, the sacrificial coating can first be applied or disposed as a wet coating on an intermediate transfer member. An example of a suitable intermediate transfer member type printer and methods for applying the sacrificial coating are disclosed in co-pending applications, U.S. patent application Ser. No. 14/493,398 filed Sep. 23, 2014 and U.S. patent application Ser. No. 14/493,474 filed Sep. 23, 2014, the disclosures of which are incorporated herein by reference in their entirety. A drying or curing process can then be employed. In embodiments, the wet coating can be heated at an appropriate temperature for the drying and curing, depending on the material or process used. For example, the wet coating can be heated to a temperature ranging from about 30° C. to about 200° C. for about 0.01 to about 100 seconds or from about 0.1 second to about 60 seconds. In embodiments, after the drying and curing process, the sacrificial coating can have a thickness ranging from about 0.02 micrometer to about 10 micrometers, or from about 0.02 micrometer to about 5 micrometers, or from about 0.05 micrometer to about 1 micrometers.

In an embodiment, the sacrificial coating can cover a portion of a major surface of the intermediate transfer member. The major outer surface of the intermediate transfer member can comprise, for example, silicone or a fluorinated polymer.

It has been found that the sacrificial coating overcomes the wet image quality problem discussed above by providing an ink wetting surface on the intermediate transfer member. The coatings may also improve image cohesion significantly to enable excellent image transfer.

EXAMPLES

Example 1

Oil-in-Water Emulsion Preparation

Five oil-in-water emulsions were prepared by loading a silicone oil, Wacker AK 500, available from Dow Corning and Wacker Chemie AG (viscosity 500 cps) silicone oil into TERGITOL TMN-6 surfactant. The loading levels are 2.5%, 5%, 7.5%, 10% and 20%. The oil-surfactant mixture was mixed using a Polytron at speed of 7000 rpm at room temperature for 1 minute. Some oil loaded at 20% was separated from surfactant. All the other 4 mixtures were very stable over a few days.

Example 2

Undercoat Composition

Table 1 shows a formulation (composition 2A) prepared with polyvinyl alcohol and oil emulsion and a formulation (composition 2B) prepared with TMN-6 surfactant without oil. The oil emulsion of composition 2A was prepared with 10% AK500 silicone oil and 90% TERGITOL TMN-6 surfactant. All these solutions are very stable.

TABLE 1

PVOH-oil emulsion vs. TMN-6 only

| Composition | PVOH | Emulsion of Tergitol TMN-6/ AK500 oil (ratio = 90:10) (%) | Surfactant TMN-6 Loading | Glycerol | DI Water | Total |
| --- | --- | --- | --- | --- | --- | --- |
| 2A | 1.50% | 0.25% | — | 5.0% | 93.25% | 100.00% |
| 2B | 1.50% | — | 0.25% | 5.0% | 93.25% | 100.00% |

Example 3

Coating Process

The undercoat compositions 2A and 2B were coated on a blanket substrate using a Pamarco anilox roll 165Q13 by hand. The blanket substrate surface was coated with a film comprising a fluorinated polymer (DAI-EL™ G-621 manufactured by Daikin Industries, Ltd.) and AO700 (an aminoethyl-aminopropyl trimethoxysilane crosslinker from Gelest). The hotplate was setup at 60° C. while the blanket substrate temperature was around 50° C. The sacrificial coating wet film thickness was around 4-5 microns and the dry film thickness was around 500 nm to 1.5 microns. The coated film was dried in oven at 60° C. for 30 seconds.

Example 4

Optical Microscope Images—Film Forming Property Evaluation

Figure 2:
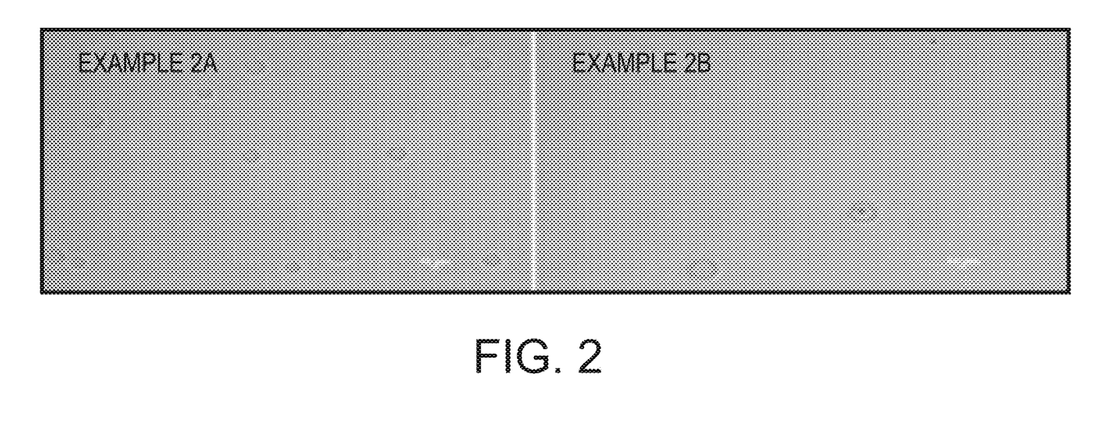
FIG. 2 shows optical microscope images taken of sacrificial coatings, as described in the examples below.

In order to make ink having good wetting and spreading on the undercoat film, it is desirable to achieve a continuous uniform film with the undercoat solution. To determine whether continuous uniform films were formed, optical microscope images were taken of the films formed in Example 3. These images are shown in FIG. 2.

Both Composition 2A and Composition 2B formed a continuous film, but with some defects on the surface. There are defects in both of the formulations, so these defects may be due to the fluorosilicone blanket, which was hand coated in the lab.

Example 5

Air Brush Transfer Test

A transfer test of the films of Example 3 was carried out using Collin ink PWK-1223. The ink was sprayed on the blankets coated with the dried films of Example 3 by air brush. The transfer condition was 320° F., 50 psi and 5 seconds dwell time. The ink was transferred from the blankets to 120 gsm Digital Color Elite Gloss paper.

Figure 3:
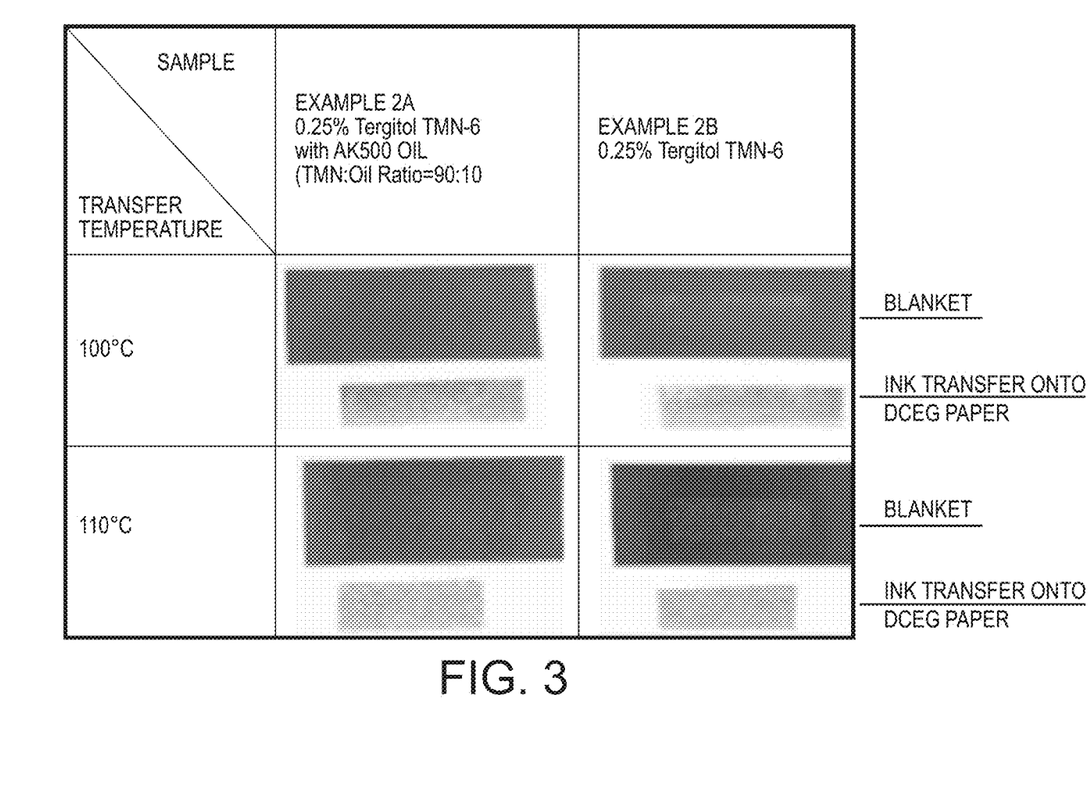
FIG. 3 shows images of ink transfer test results, as discussed in the examples below.

The images of FIG. 3 show the transfer results for the film of composition 2A (made with oil emulsion) vs. the film of composition 2B (made with TMN-6 surfactant only (no oil)) at different transfer temperatures. The top image is the blanket after transfer and the bottom image is the DCEG paper after ink was transferred. The ink tested here can only be transferred at around 120° C. for undercoat without loading of oil emulsion. Much less residual ink remains on the blanket for formulations with the oil emulsion at lower transfer temperatures. The transfer temperature can be dropped around 20° C. for formulation with oil emulsion (from 120° C. to 100° C.). The darker the DCEG paper, the better the ink transferred. These results show that the film made with the oil emulsion resulted in a reduction in transfer temperature and improved release properties.

Example 6

Undercoat Compositions

Example 6

Sacrificial coating compositions were prepared with Xerox experimental latex-L, a styrene/n-butyl acrylate/methacrylic acid terpolymer with a relatively low Tg of about 52° C. to about 53° C. or Xerox experimental latex-H, a styrene/n-butyl acrylate/methacrylic acid terpolymer with a relatively high Tg of about 80° C. to about 82° C. The components for these example latexes are shown in more detail in Table 2 below. The oil-in-water emulsions of examples 6-1, 6-2 and 6-3 were prepared with 10% AK500 silicone oil and 90% Tergitol TMN-6 surfactant. All these solutions were very stable.

TABLE 2

| Latex Type | XRCC Latex-L | XRCC Latex-H |
|---|---|---|
| Styrene (%) | 54 | 67.9 |
| nBA (%) | 34 | 18.6 |
| Methacrylic acid (%) | 12 | 13.5 |
| bCEA (pph on St + nBA + MAA) | 3 | 3 |
| ADOD (pph on St + nBA + MAA) | 0.35 | 0.35 |
| DDT#1 (pph on total St + nBA + MAA) | 0.62 | 0.26 |
| DDT#2 (pph on total St + nBA + MAA) | 2.44 | 2.13 |
| Dowfax (pph on St + nBA + MAA) | 1 | 1 |
| APS (pph on St + nBA + MAA) | 1.5 | 1.5 |
| Dowfax partition | 15/85 | 15/85 |
| Seed % | 1 | 1 |
| Particle Size D50 (nm) | 100.3 | 120.1 |
| Particle Size D95 (nm) | 141.1 | 172.4 |
| Zeta Potential (mV) ± STD | −64.5 ± 15.0 | −63.6 ± 10.2 |
| Conductivity (mS/cm) | 0.129 | 0.074 |
| pH | 1.8 | 1.83 |
| Solids (%) | 39.9 | 41.9 |
| Mw (k) | 43.2 | 47.4 |
| Mn (k) | 12.4 | 13.6 |
| PDI (polydispersity) | 3.5 | 3.5 |
| Tg (° C.) - onset | 52.9 | 81.8 |
| Acid Value (titration) | 95.1 | 50.7 |
| Styrene (ppm) in latex | 56 | 98 |
| nBA (ppm) in latex | 884 | 14 |
| MAA (ppm) in latex | 51 | 149 |
| % Gel Content | 3.8 | 13.4 |
| Ts (softening point ° C.) | 142.3 | 161.9 |

Example 6-1

A sacrificial coating solution was prepared by combining and mixing 31.25 g Xerox experimental latex-L and 18.75 g glycerol into 49.75 g DI water. Next, 0.25 g oil-in-water emulsion was added into the mixture to make it 100 g of solution.

Example 6-1A

A sacrificial coating solution was prepared by combining and mixing 31.25 g Xerox experimental latex-L and 18.75 g glycerol into 49.75 g DI water. Next, 0.25 g TMN-6 surfactant was added into the mixture to make it 100 g of solution.

Example 6-2

A sacrificial coating solution was prepared by combining and mixing 31.25 g Xerox experimental latex-L and 18.75 g sorbitol into 49.75 g DI water. Next, 0.25 g oil-in-water emulsion was added into the mixture to make it 100 g of solution.

Example 6-2A

A sacrificial coating solution was prepared by combining and mixing 31.25 g Xerox experimental latex-L and 18.75 g sorbitol into 49.75 g DI water. Next, 0.25 g Tergitol TMN-6 surfactant was added into the mixture to make it 100 g of solution.

Example 6-3

A sacrificial coating solution was prepared by combining and mixing 31.25 g Xerox experimental latex-H and 18.75 g sorbitol into 49.75 g DI water. Next, 0.25 g oil-in-water emulsion was added into the mixture to make it 100 g of solution.

Example 6-3A

A sacrificial coating solution was prepared by combining and mixing 31.25 g Xerox experimental latex-H and 18.75 g sorbitol into 49.75 g DI water. Next, 0.25 g Tergitol TMN-6 surfactant was added into the mixture to make it 100 g of solution.

Example 7

Undercoat Compositions

Example 7

Sacrificial coating compositions were prepared with commercially available BASF acrylic latexes included Joncryl® 74-A, which is a soft film forming acrylic emulsion that provides film formation and excellent rub, water, and grease resistance to ink, overprint varnish, and functional packaging. Joncryl® 77 is a hard film forming acrylic latex which provides film formation and printability to ink and overprint varnish formulations. The oil-in-water emulsions of Examples 7-1 and 7-2 were prepared with 10% AK500 silicone oil and 90% Tergitol TMN-6 surfactant. All these solutions were very stable. Coating solutions were prepared as follows:

Example 7-1

A sacrificial coating solution was prepared by combining and mixing 31.25 g BASF Joncryl 74A latex and 18.75 g sorbitol into 49.75 g DI water. Next, 0.25 g oil-in-water emulsion was added into the mixture to make it 100 g of solution.

Example 7-1A

A sacrificial coating solution was prepared by combining and mixing 31.25 g BASF Joncryl 74A latex and 18.75 g sorbitol into 49.75 g DI water. Next, 0.25 g TMN-6 surfactant was added into the mixture to make it 100 g of solution.

Example 7-2

A sacrificial coating solution was prepared by combining and mixing 31.25 g BASF Joncryl 77 latex and 18.75 g sorbitol into 49.75 g DI water. Next, 0.25 g oil-in-water emulsion was added into the mixture to make it 100 g of solution.

Example 7-2A

A sacrificial coating solution was prepared by combining and mixing 31.25 g BASF Joncryl 77 latex and 18.75 g sorbitol into 49.75 g DI water. Next, 0.25 g TMN-6 was added into the mixture to make it 100 g of solution.

Example 8

Undercoat Composition

The formulations of Table 2 were prepared with Celanese latexes and either an oil-in-water emulsion or a TMN-6 surfactant (no oil, surfactant only). The formulations of Example 8-1 and Comparative Example 8-1A included RESYN 2920, which is an emulsion comprising an organic acrylic polymer and inorganic silica. The two phases of this emulsion are chemically linked to insure homogeneous distribution. The formulations of Examples 8-2 and 8-3 and Comparative Examples 8-2A and 8-3A included Dur-O-Cryl 69A, which is a water-based acrylic polymer with self-crosslinking functionality. The oil-in-water emulsions were all prepared with 10% AK500 silicone oil and 90% Tergitol TMN-6 surfactant. All these solutions were very stable.

Example 8-1

A sacrificial coating solution was prepared by combining and mixing 31.25 g Celanese Resyn 2920 latex and 18.75 g glycerol into 49.75 g DI water. Next, 0.25 g oil-in-water emulsion was added into the mixture to make it 100 g of solution.

Example 8-1A

A sacrificial coating solution was prepared by combining and mixing 31.25 g Celanese Resyn 2920 latex and 18.75 g glycerol into 49.75 g DI water. Next, 0.25 g Tergitol TMN-6 surfactant was added into the mixture to make it 100 g of solution.

Example 8-2

A sacrificial coating solution was prepared by combining and mixing 31.25 g Celanese Dur-O-Cryl latex and 18.75 g glycerol into 49.75 g DI water. Next, 0.25 g oil-in-water emulsion was added into the mixture to make it 100 g of solution.

Example 8-2A

A sacrificial coating solution was prepared by combining and mixing 31.25 g Celanese Dur-O-Cryl latex and 18.75 g glycerol into 49.75 g DI water. Next, 0.25 g Tergitol TMN-6 surfactant was added into the mixture to make it 100 g of solution.

Example 8-3

A sacrificial coating solution was prepared by combining and mixing 31.25 g Celanese Dur-O-Cryl 69A latex and 18.75 g sorbitol into 49.75 g DI water. Next, 0.25 g oil-in-water emulsion was added into the mixture to make it 100 g of solution.

Example 8-3A

A sacrificial coating solution was prepared by combining and mixing 31.25 g Celanese Dur-O-Cryl 69A latex and 18.75 g sorbitol into 49.75 g DI water. Next, 0.25 g Tergitol TMN-6 surfactant was added into the mixture to make it 100 g of solution.

Example 9

Coating Process

Each of the undercoat solutions of Examples 6, 7 and 8 were coated on blanket substrate using anilox roll 165Q13 by hand. The substrate was made from fluorinated polymer G621 with AO700 as a crosslinker. The hotplate was setup at 60° C. while the substrate temperature was around 50° C. The wet film thickness was around 4-5 microns and the dry film thickness was around 500 nm to 1.5 microns. The coated film was dried in oven at 60° C. for 30 seconds.

Example 10

Optical Microscope Images—Film Forming Property Evaluation

Figure 4:
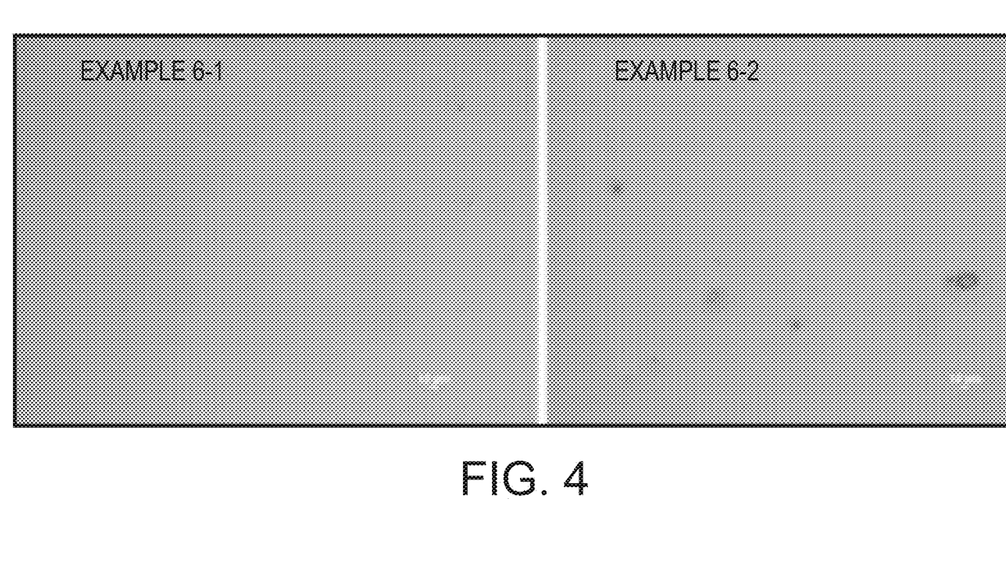
FIGS. 4, 5 and 6 show optical microscope images taken of sacrificial coatings, as described in the examples below
Figure 5:
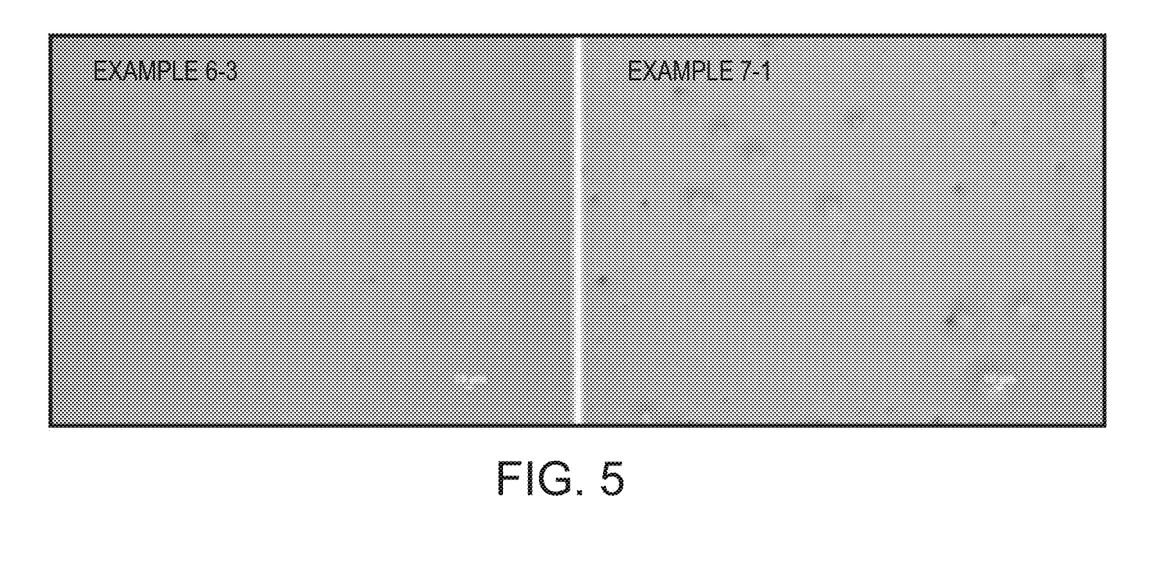
Figure 6:
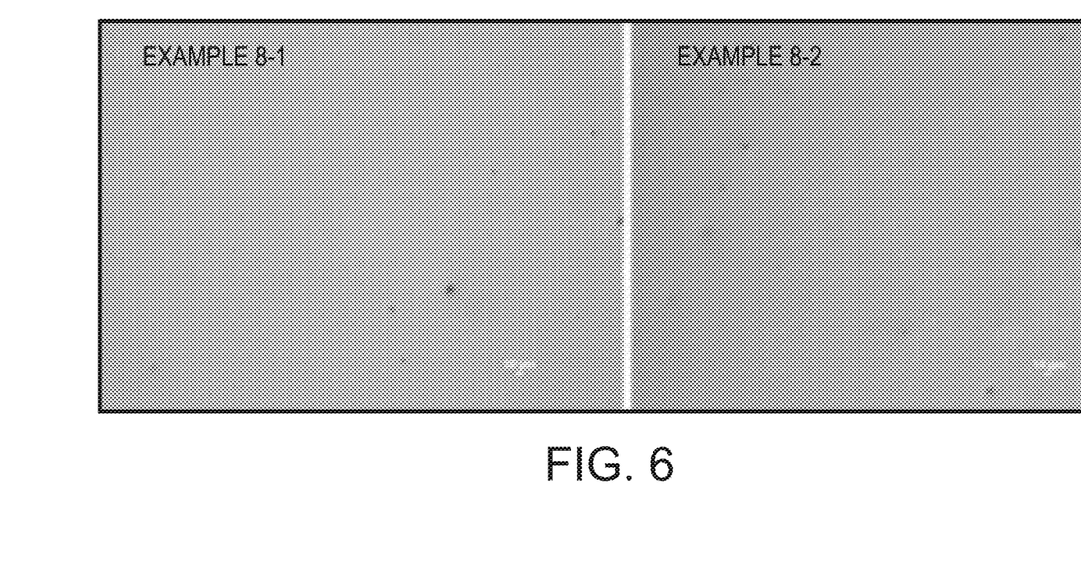

In order to make ink having good wetting and spreading on the undercoat films, it is desirable to achieve a continuous uniform film with undercoat solution. FIGS. 4, 5 and 6 show optical microscope images taken of films made from the compositions of Examples 6, 7 and 8, which were coated on G621 blanket substrates.

Example 6-1 and Example 6-2 were prepared using Xerox experimental latex-L but different humectants. Example 6-1 was loaded with 18.75% glycerol; Example 6-2 was loaded with 18.75% sorbitol. Both formulations form a nice continuous uniform film, as shown by the optical microscope images of FIG. 4.

Example 6-3 was prepared using Xerox experimental-H latex. Example 7-1 was prepared using BASF Joncryl 74A latex. Both formulation use the same humectant (sorbitol). Formulation using Xerox experimental latex-H generates a continuous and more uniform coating film, as shown by the optical microscope images of FIG. 5.

Examples 8-1 and 8-2 were prepared using the same humectant (glycerol) but different latexes from Celanese. A Resyn 2920 latex was used in the Example 8-1 formulation; Dur-O-Cryl 69A was used in the Example 8-2 formulation. The surface uniformity for both formulations was very similar, as shown by the optical microscope images of FIG. 6.

Example 11

Air Brush Transfer Test

Collin ink PWK-1223 was used for transfer test. The ink was sprayed on the coated blanket by air brush. The transfer condition was 320° F., 50 psi and 5 seconds dwell time. The ink was transferred from blanket to 120 gsm Digital Color Elite Gloss paper.

Figure 7:
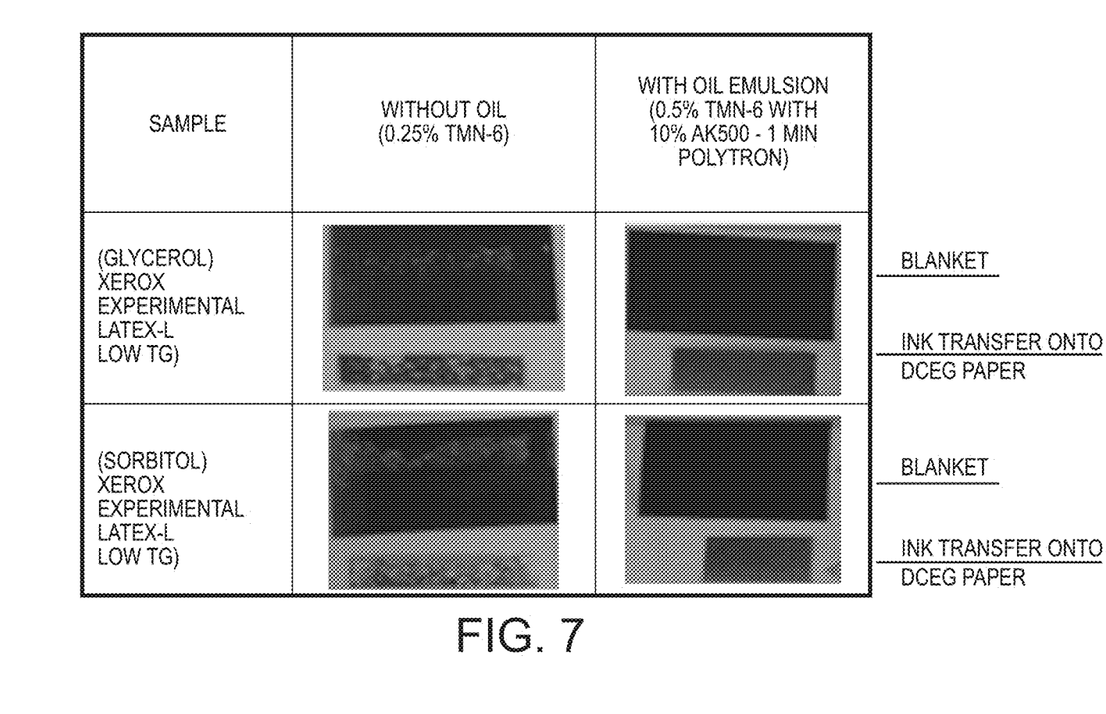
FIGS. 7 and 8 shows images of ink transfer test results, as discussed in the examples below.

The images of FIG. 7 show the transfer results of the coatings of Examples 6-1A and 6-2A (with no oil-in-water emulsion) vs. Examples 6-1 and 6-2 (with oil-in-water emulsion). The Example 6-1 and 6-1A are the results shown in the top row and Example 6-2 and 6-2A are the results shown in the bottom row. The top image in each row is the blanket after transfer and the bottom image is the DCEG paper after ink transfer. There is much less residual ink on the blanket coated with an oil-in-water emulsion solution. There are some residual ink on the blanket coated with no oil-in-water emulsions (Examples 6-1A and 6-2A, in column labeled "without oil"). The darker the DCEG paper, the better the ink transferred.

Figure 8:
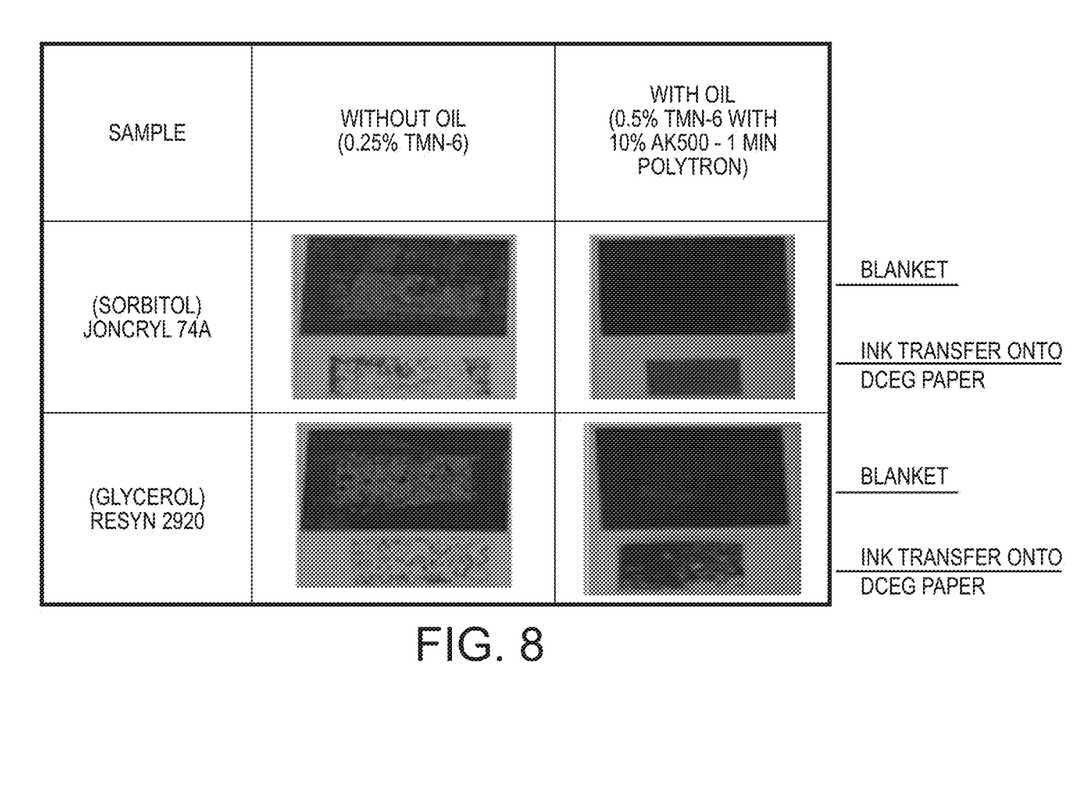

The group images of FIG. 8 show the transfer test results for two sets of formulations, the first made with BASF latex Joncryl 74A loaded with sorbitol (Examples 7-1 and 7-1A in the top row) and the second made with Celanese latex Resyn 2920 loaded with glycerol (Examples 8-1 and 8-1A in the bottom row). The top image is the blanket after transfer and the bottom image is the DCEG paper after ink transfer. There is a lot of residual ink on blanket for the formulations without oil emulsion (Examples 7-1A and 8-1A, in column labeled "without oil"). The ink transfer was dramatically improved after loading with the oil emulsion.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. An method of making a sacrificial coating composition, the method comprising:
   emulsifying an oil with surfactant and water to form an oil-in-water emulsion, the oil being selected from the group consisting of a silicone oil, a perfluoroether oil and a hydrocarbon oil and mixtures thereof and the surfactant comprising a branched secondary alcohol ethoxylate with 6 to 12 moles of ethylene oxide (EO);
   combining ingredients comprising (i) at least one polymer, (ii) at least one hygroscopic material, (iii) the oil-in water emulsion and (iv) water to produce the sacrificial coating composition,
   wherein the at least one polymer is polyvinyl alcohol.

2. The method of claim 1, wherein combining ingredients comprises mixing the at least one polymer, the at least one hygroscopic material and water to form a polymer mixture and then combining the polymer mixture and the oil-in-water emulsion.

3. The method of claim 1, wherein the emulsifying comprises mixing the oil and surfactant at a high shear speed of at least 6000 RPM.

4. The method of claim 1, wherein the oil is loaded in the surfactant at a concentration ranging from about 0.1 wt % to about 15 wt %, relative to the combined weight of the oil and surfactant.

5. The method of claim 1, wherein the method further comprises heating the polyvinyl alcohol in water to a temperature of at least about 80° C. for a time ranging from about 30 minutes to about 90 minutes prior to combining ingredients to dissolve the polyvinyl alcohol.

6. The method of claim 1, wherein the polyvinyl alcohol has a hydrolysis degree ranging from about 75% to about 99.5% and weight average molecular weight ranging from about 8000 to about 30,000 g-mole$^{-1}$.

7. The method of claim 6, wherein the viscosity of the polyvinyl alcohol in a DI water solution at 20° C. ranges from about 3 cps to about 100 cps, wherein the solution contains 4% by weight polyvinyl alcohol relative to the total weight of polyvinyl alcohol and DI water in the solution.

8. The method of claim 1, wherein the sacrificial coating composition further comprises a waxy maize starch.

9. The method of claim 8, wherein the waxy maize starch comprises more than 90 weight percent amylopectin.

10. The method of claim 1, wherein the at least one hygroscopic material is selected from the group consisting of glycerol, sorbitol, glycols, vinyl alcohols, xylitol, maltitol, polymeric polyols, glyceryl triacetate, glycouril, ionic liquids and mixtures thereof.

11. The method of claim 1, wherein the surfactant is a nonionic surfactant with hydrophile lipophile balance (HLB) value of from 4 to 15.

12. The method of claim 1, wherein the surfactant comprises a mixture of a first surfactant and a second surfactant that is different from the first surfactant, the first surfactant having a hydrophile lipophile balance ("HLB") value ranging from about 8 to about 15 and the second surfactant having an HLB value ranging from about 4 to about 10, the HLB value for the first surfactant being higher that the HLB value for the second surfactant.

13. The method of claim 1, wherein the oil is selected from the group consisting of a silicone oil, a perfluoroether oil and mixtures thereof.

* * * * *